US010027331B2

(12) United States Patent
Yonezawa et al.

(10) Patent No.: US 10,027,331 B2
(45) Date of Patent: Jul. 17, 2018

(54) OSCILLATOR, ELECTRONIC APPARATUS, AND MOVING OBJECT

(71) Applicant: Seiko Epson Corporation, Tokyo (JP)

(72) Inventors: Takemi Yonezawa, Minowa-machi (JP); Masaaki Okubo, Namie-machi (JP); Kenji Hayashi, Hino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 5 days.

(21) Appl. No.: 15/069,306

(22) Filed: Mar. 14, 2016

(65) Prior Publication Data

US 2016/0277031 A1 Sep. 22, 2016

(30) Foreign Application Priority Data

Mar. 16, 2015 (JP) ................. 2015-052183

(51) Int. Cl.
| | |
|---|---|
| *H03B 5/32* | (2006.01) |
| *H03L 1/04* | (2006.01) |
| *H03L 1/02* | (2006.01) |
| *H03B 5/36* | (2006.01) |
| *H03L 1/00* | (2006.01) |

(52) U.S. Cl.
CPC ............. *H03L 1/04* (2013.01); *H03B 5/32* (2013.01); *H03B 5/36* (2013.01); *H03L 1/00* (2013.01); *H03L 1/023* (2013.01); *H03L 1/026* (2013.01); *H03L 1/028* (2013.01)

(58) Field of Classification Search
CPC . H03L 1/04; H03L 1/026; H03L 1/023; H03L 1/00; H03L 1/028; H03B 5/36; H03B 5/32

USPC .............. 331/176, 177 V, 158, 116 FE
See application file for complete search history.

(56) References Cited

U.S. PATENT DOCUMENTS

| 5,986,515 A * | 11/1999 | Sakurai ............... H03L 1/028 |
| | | 331/158 |
| 8,754,718 B2 * | 6/2014 | Horie ................. H02N 2/001 |
| | | 331/158 |
| 2006/0192626 A1 * | 8/2006 | Milliren ............... H03B 5/04 |
| | | 331/158 |
| 2007/0291676 A1 | 12/2007 | Berggren |
| 2008/0122549 A1 * | 5/2008 | Greenberg ........... H03L 5/00 |
| | | 331/183 |

FOREIGN PATENT DOCUMENTS

| JP | 2009-540719 A | 11/2009 |
| JP | 2011-101212 A | 5/2011 |
| WO | 2007144690 A1 | 12/2007 |

* cited by examiner

*Primary Examiner* — Arnold Kinkead
(74) *Attorney, Agent, or Firm* — Oliff PLC

(57) ABSTRACT

An oscillator includes a resonator; an oscillation circuit which oscillates the resonator; a D/A conversion circuit which receives digital data for controlling a frequency of the oscillation circuit; a first temperature sensor; and a temperature compensation circuit which is connected to the first temperature sensor. The oscillation circuit includes a first variable capacitor element and a second variable capacitor element. An output voltage of the D/A conversion circuit is applied to the first variable capacitor element. An output voltage of the temperature compensation circuit is applied to the second variable capacitor element.

20 Claims, 15 Drawing Sheets

OSCILLATOR, ELECTRONIC APPARATUS, AND MOVING OBJECT

BACKGROUND

1. Technical Field

The present invention relates to an oscillator, an electronic apparatus, and a moving object.

2. Related Art

A crystal oscillator which is used for a reference frequency signal source of a communication apparatus or a measurement apparatus is required to be stable in output frequency with high accuracy with respect to a temperature change. In general, an oven controlled crystal oscillator (OCXO) is known as a crystal oscillator which obtains extremely high frequency stability. Furthermore, recently, characteristics of a temperature compensated crystal oscillator (TCXO) have improved dramatically, and have been developed to the extent of approaching the frequency accuracy or frequency stability of the OCXO.

An oscillator with such a high accuracy is used for, for example, abase station or the like for mobile phones, and an oscillator which can control a frequency using a digital control may be required. JP-A-2011-101212 discloses a piezoelectric oscillator which includes a D/A converter, a vibrator, and an oscillation loop circuit, and varies a frequency of a signal that is output from an oscillator by changing an input signal with respect to the D/A converter.

However, if it is assumed that a control of varying a frequency and temperature characteristic compensation of a frequency are simultaneously performed, it is necessary to add the amount of temperature correction to a bit value of a digital input signal, a select range of a bit value which can be used as a frequency variable voltage is narrowed, and thus, there is a problem in which a frequency control range is narrowed.

SUMMARY

An advantage of some aspects of the invention is to provide an oscillator which can perform temperature compensation without narrowing a frequency control range. In addition, another advantage of some aspects of the invention is that it is possible to provide an electronic apparatus and a moving object that use the oscillator.

The invention can be implemented as the following forms or application examples.

Application Example 1

An oscillator according to this application example includes: a resonator; an oscillation circuit which oscillates the resonator; a D/A conversion circuit which receives digital data for controlling a frequency of the oscillation circuit; a first temperature sensor; and a temperature compensation circuit which is connected to the first temperature sensor, in which the oscillation circuit includes a first variable capacitor element and a second variable capacitor element, in which an output voltage of the D/A conversion circuit is applied to the first variable capacitor element, and in which an output voltage of the temperature compensation circuit is applied to the second variable capacitor element.

The oscillation circuit may be a part or all of various oscillation circuits such as, a Pierce oscillation circuit, an inverter type oscillation circuit, a Colpitts oscillation circuit, and a Hartley oscillation circuit.

In the oscillator according to this application example, a voltage which is obtained by adding an output voltage of the D/A conversion circuit to an output voltage of the temperature compensation circuit is not applied to one variable capacitor element, the output voltage of the D/A conversion circuit and the output voltage of the temperature compensation circuit are respectively applied to the first variable capacitor element and the second variable capacitor element which are different from each other, and thus, the frequency of the oscillation circuit is controlled. As a result, a part of a voltage range of the output of the D/A conversion circuit need not be assigned for temperature compensation, a full voltage range of the output of the D/A conversion circuit can be assigned for a frequency control range, the frequency control range can be widened while maintaining resolution of the frequency control, or the resolution of the frequency control can be increased while maintaining the frequency control range. Hence, according to the application example, it is possible to realize the oscillator which can control an oscillation frequency in accordance with digital data and can perform temperature compensation without narrowing the frequency control range.

Application Example 2

The oscillator according to the application example may further include a second temperature sensor which detects the temperature of the resonator; a heating element for heating the resonator; and a heat control circuit which controls the heating element on the basis of an output signal of the second temperature sensor.

According to this application example, it is possible to realize a novel thermostatic oven type oscillator which can control an oscillation frequency in accordance with digital data.

In addition, according to the oscillator of this application example, not only the control which is performed by the heat control circuit, but also temperature compensation which is performed by the temperature compensation circuit is performed, and thus, the oscillation frequency can be compensated, even if the temperature of the oscillator or the oscillation circuit changes due to a change of the peripheral temperature of the oscillator. Hence, according to the oscillator of the application example, it is possible to realize high frequency stability.

Application Example 3

The oscillator according to the application example may further include a heating element for heating the resonator; and a heat control circuit which controls the heating element on the basis of an output signal of the first temperature sensor, in which the first temperature sensor may detect the temperature of the resonator.

According to the oscillator of this application example, the first temperature sensor is used for both the control which is performed by the heat control circuit, and temperature compensation which is performed by the temperature compensation circuit, and thus, it is possible to reduce manufacturing costs and to achieve miniaturization, while realizing high frequency stability.

Application Example 4

The oscillator according to the application example may further include a low pass filter, in which an output voltage of the D/A conversion circuit may be applied to the first variable capacitor element through the low pass filter.

Noise which overlaps a voltage applied to the first variable capacitor element has high frequency sensitivity, and mainly causes degradation of frequency accuracy. However, in the oscillator according to this application example, the noise which overlaps an output voltage of the D/A conversion circuit is attenuated by the low pass filter, and thus, it is possible to reduce the noise which overlaps the voltage applied to the first variable capacitor element. Hence, according to the oscillator of the application example, it is possible to increase frequency accuracy and to achieve high frequency stability.

Application Example 5

An electronic apparatus according to this application example includes any one of the oscillators described above.

Application Example 6

A moving object according to this application example including any one of the oscillators described above.

According to these application examples, an oscillator is used which controls an oscillation frequency in accordance with digital data and can perform temperature compensation without narrowing a frequency control range, and thus, it is possible to realize, for example, an electronic apparatus and a moving object with higher reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments according to the invention will be described in detail with reference to the accompanying drawings. The embodiments which are described below are not intended to unduly limit the content of the invention which is described in the scope of the appended claims. In addition, the configurations which are described below are not all the essential configuration requirements of the invention.

1. Oscillator 1-1. First Embodiment

Figure 1:
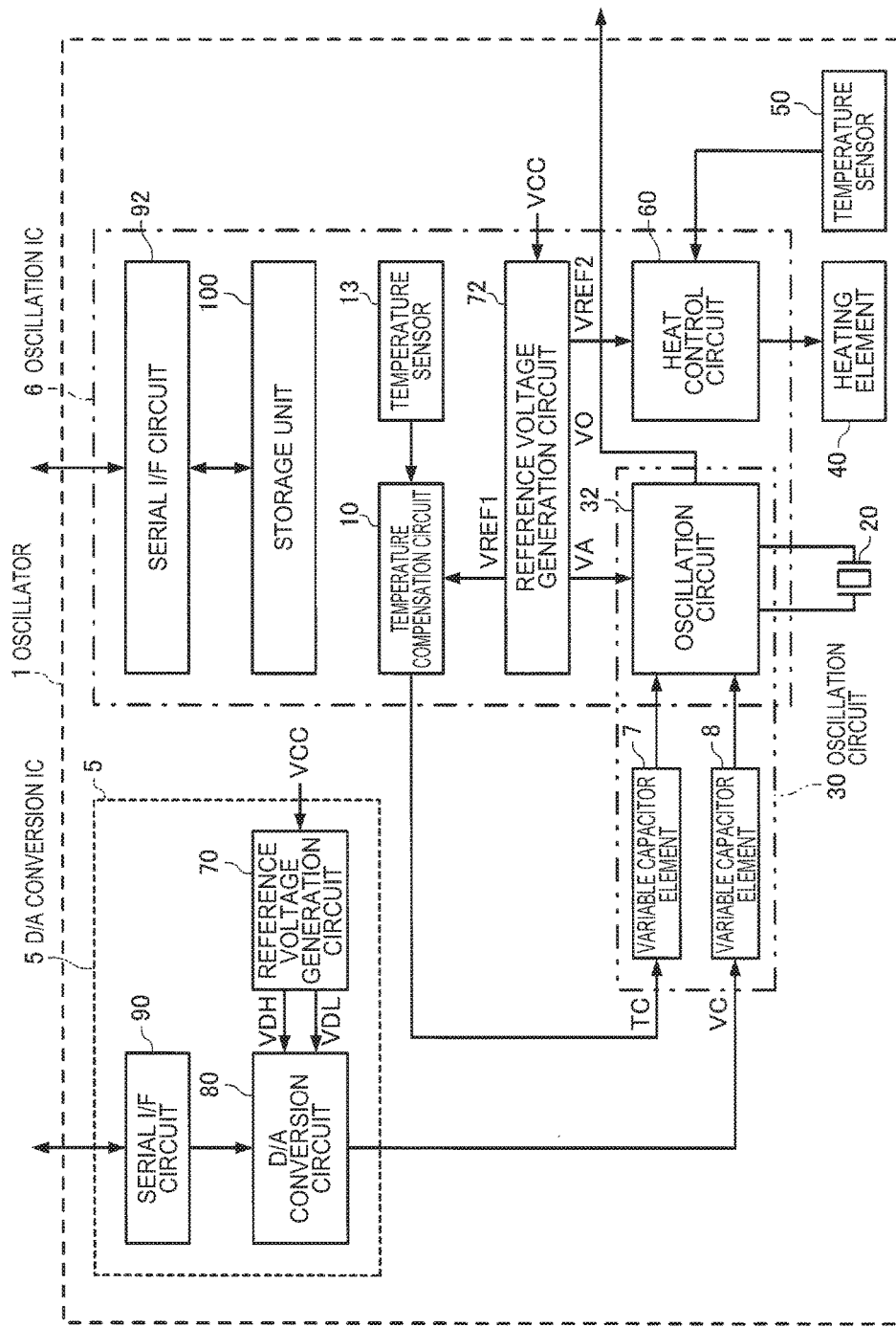
FIG. 1 is a functional block diagram of an oscillator according to a first embodiment.

FIG. 1 is an example of a functional block diagram of an oscillator according to a first embodiment. In addition, FIG. 2 is an example of a sectional diagram of the oscillator according to the first embodiment.

As described in FIG. 1, an oscillator 1 according to the first embodiment is configured to include a resonator 20, a D/A conversion integration circuit (IC) 5, an oscillation integrated circuit (IC) 6, a variable capacitor element 7 (an example of a second variable capacitor element), a variable capacitor element 8 (an example of a first variable capacitor element), a heating element 40 which heats the resonator 20, and a temperature sensor 50 (an example of a second temperature sensor). However, the oscillator 1 according to the present embodiment may have a configuration in which a part of the configuration elements illustrated in FIG. 1 is omitted or modified, or other configuration elements are added.

Figure 2:
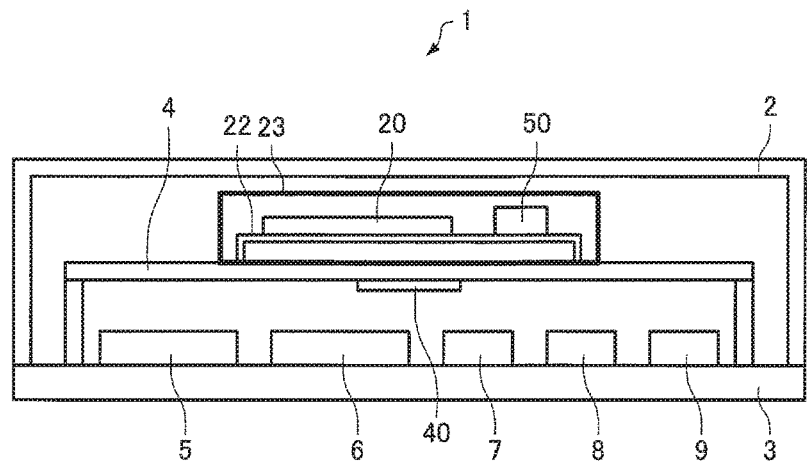
FIG. 2 is a sectional diagram of the oscillator according to a first embodiment.

As illustrated in FIG. 2, the oscillator 1 according to the first embodiment includes a component mounting substrate 3, having an upper surface on which the D/A conversion IC 5, the oscillation IC 6, the variable capacitor element 7, the variable capacitor element 8, and other one or more electronic components 9 (resistor, capacitor, coil, or the like) are mounted. In addition, a component mounting substrate 4 is provided to face the component mounting substrate 3. A component mounting substrate 22, the resonator 20 provided on an upper surface of the component mounting substrate 22, a package 23 (for example, ceramic package) in which the temperature sensor 50 is contained, are mounted on an upper surface of the component mounting substrate 4. The heating element 40 is provided in a position which faces the package 23, on a lower surface of the component mounting substrate 4.

Each terminal of the variable capacitor element 7, the variable capacitor element 8, the electronic components 9, the resonator 20, the heating element 40, and the temperature sensor 50 is respectively and electrically connected to each desired terminal of the D/A conversion IC 5 or the oscillation IC 6 by wiring patterns which are not illustrated. Then, a case (or cover) 2 is attached to the component mounting substrate 3 so as to contain the component mounting substrate 4, the D/A conversion IC 5, the oscillation IC 6, the variable capacitor element 7, the variable capacitor element 8, the electronic component 9, the resonator 20, the heating element 40, and the temperature sensor 50 are contained therein. The oscillator 1 uses a space formed by the case 2 and the component mounting substrate 3 as a thermostatic oven, and controls such that temperature inside the thermostatic oven is maintained to be nearly constant by the heating element 40.

As illustrated in FIG. 1, the D/A conversion IC 5 is configured to include a reference voltage generation circuit 70, a D/A conversion circuit 80, and a serial interface circuit 90. However, the D/A conversion IC 5 may have a configuration in which a part of the configuration elements is omitted or modified, or other configuration elements are added.

The serial interface circuit 90 acquires a serial data signal (digital data for controlling a frequency of the oscillation circuit 30) which is input from the outside (outside of the oscillator 1) of the D/A conversion IC 5, converts the serial data signal into a data signal of N bits, and outputs the data signal to the D/A conversion circuit 80.

The reference voltage generation circuit 70 generates a high potential side reference voltage VDH and a low potential side reference voltage VDL of the D/A conversion circuit 80, based on a power supply voltage VCC which is supplied from the outside (outside of the oscillator 1) of the D/A conversion IC 5.

The D/A conversion circuit 80 receives the data signal (digital data for controlling a frequency of the oscillation circuit 30) of N bits which are output from the serial interface circuit 90, converts the data signal of N bits into an analog signal of a voltage between the high potential side reference voltage VDH and the low potential side reference voltage VDL, and outputs the analog signal. The D/A conversion circuit 80 is well known, and can use units of various types such as, a resistance dividing type (referred to as voltage distribution type, resistor string type, or voltage potentiometer type), a resistor ladder (R-2R ladder type, or the like), the capacitor array type, or a delta-sigma type.

A voltage (control voltage) VC of the analog signal which is output from the D/A conversion circuit 80 is applied to the variable capacitor element 8 in the outside of the D/A conversion IC 5, and a capacitance value of the variable capacitor element 8 changes in accordance with the control voltage VC. The variable capacitor element 8 may be, for example, a variable capacitor diode (varactor) of which the capacitance value changes in accordance with the control voltage VC that is applied to one terminal thereof.

The oscillation IC 6 is configured to include a temperature compensation circuit 10, a temperature sensor 13 (an example of a first temperature sensor), an oscillation circuit 32, a heat control circuit 60, a reference voltage generation circuit 72, a serial interface circuit 92, and a storage unit 100. However, the oscillation IC 6 may have a configuration in which a part of the configuration elements is omitted or modified, or other configuration elements are added.

The temperature compensation circuit 10 is connected to the temperature sensor 13, and generates a temperature compensation voltage TC for compensating for frequency-temperature characteristics of an output signal of the oscillation circuit 30, in accordance with an output signal of the temperature sensor 13. For example, the temperature compensation circuit 10 may be able to perform only correction (hereinafter, referred to as "first-order correction") of first-order components of the output signal of the oscillation circuit 30, may be able to perform only correction (hereinafter, referred to as "second-order correction") of second-order components, and may be able to perform both the first-order correction and the second-order correction. In addition, if both the first-order correction and the second-order correction can be performed, the temperature compensation circuit 10 may be able to set independently whether each of the first-order correction and the second-order correction is enabled or disabled, and may be able to set independently each of correction parameters of the first-order correction and correction parameters of the second-order correction. Furthermore, the temperature compensation circuit 10 may be able to perform the second-order corrections in multiple temperature regions (for example, low temperature side and high temperature side) independently from each other.

The temperature sensor 13 outputs a voltage according to peripheral temperature thereof, may have a positive polarity in which an output voltage thereof increases as temperature increases, and may have a negative polarity in which the output voltage decreases as temperature increases.

The temperature compensation voltage TC which is output from the temperature compensation circuit 10 is applied to the variable capacitor element 7 in the outside of the oscillation IC 6, and a capacitance value of the variable capacitor element 7 changes depending on the temperature compensation voltage TC. The variable capacitor element 7 may be, for example, a variable capacitor diode (varactor) of which the capacitance value changes in accordance with the temperature compensation voltage TC that is applied to one terminal thereof.

The oscillation circuit 32, the variable capacitor element 7 attached to the outer side of a terminal of the oscillation IC 6, the variable capacitor element 8, and the electronic components 9 (not illustrated in FIG. 1) configure the oscillation circuit 30 which makes the resonator 20 oscillate.

The oscillation circuit 30 outputs an oscillation signal VO by oscillating the resonator 20 using a signal of a frequency according to a capacitance value of the variable capacitor element 7 and a capacitance value of the variable capacitor element 8. The oscillation signal VO which is output from the oscillation circuit 30 is output to the outside (outside of the oscillator 1) of the oscillation IC 6.

For example, a crystal vibrator of SC-cut or AT-cut, a surface acoustic wave (SAW) resonator, or the like can be used for the resonator 20. In addition, for example, a piezoelectric vibrator, a micro electro mechanical system (MEMS) vibrator, or the like, in addition to the crystal vibrator can be used for the resonator 20. Piezoelectric single crystal such as, quartz crystal, lithium tantalate, or lithium niobate, a piezoelectric material such as piezoelectric ceramics such as lead zirconate titanate, a silicon semiconductor material, or the like can be used as a substrate material of the resonator 20. In addition, a device using piezoelectric effects may be used or electrostatic drive by Coulomb force may be used as an excitation unit of the resonator 20.

The heat control circuit 60 is disposed near the resonator 20, and controls the heating element 40 for heating the resonator 20, based on an output voltage of the temperature sensor 50 which detects the temperature of the resonator 20. Specifically, heating of the heating element 40 is controlled such that temperature is maintained to be constant, in accordance with an output voltage of the temperature sensor 50.

For example, an element (a power transistor, a resistor, or the like) which is heated by flowing of a current may be used as the heating element 40. In addition, for example, a thermistor (a negative temperature coefficient (NTC) thermistor or a positive temperature coefficient (PTC) thermistor), a platinum resistor, or the like can be used for the temperature sensor 50.

For example, the temperature sensor 50 with temperature characteristics of a positive slope is disposed near the resonator 20, the heat control circuit 60 heats the heating element 40 by making a current flow through the heating element when an output voltage of the temperature sensor 50 is lower than a reference value, and does not make a current flow through the heating element 40 when the output voltage of the temperature sensor 50 is higher than the reference value.

The reference voltage generation circuit 72 generates a power supply voltage VA of the oscillation circuit 30, a reference voltage VREF1 of the temperature compensation circuit 10, a reference voltage VREF2 of the heat control circuit 60, and the like, based on the power supply voltage VCC which is supplied from the outside (outside of the oscillator 1) of the oscillation IC 6.

The storage unit 100 is configured to include a non-volatile memory or a register which is not illustrated, and the non-volatile memory stores setting information (information on whether each of the first-order correction and the second-order correction is performed or not, correction parameters of the first-order correction, correction parameters of the second-order correction, or the like) of a temperature compensation circuit, or the like. The non-volatile memory can be realized by, for example, a flash memory such as a metal-oxide-nitride-oxide-silicon (MONOS) memory, an electrically erasable programmable read only memory (EEPROM), or the like.

Each piece of setting information stored in the non-volatile memory is transferred to a register from the non-volatile memory when a power supply voltage is supplied to the oscillation IC 6 (when the power supply voltage VCC increases from 0 V to a desired voltage), and is retained in the register. Then, each piece of setting information retained in the register is supplied to the temperature compensation circuit 10 or the like.

The serial interface circuit 92 performs reading from or writing to the storage unit 100 (non-volatile memory and register) from the outside (outside of the oscillator 1) of the oscillation IC 6. The serial interface circuit 92 may be an interface circuit corresponding to, for example, an inter-integrated circuit (I²C) bus, and may be an interface circuit corresponding to a serial peripheral interface (SPI) bus.

Figure 3:
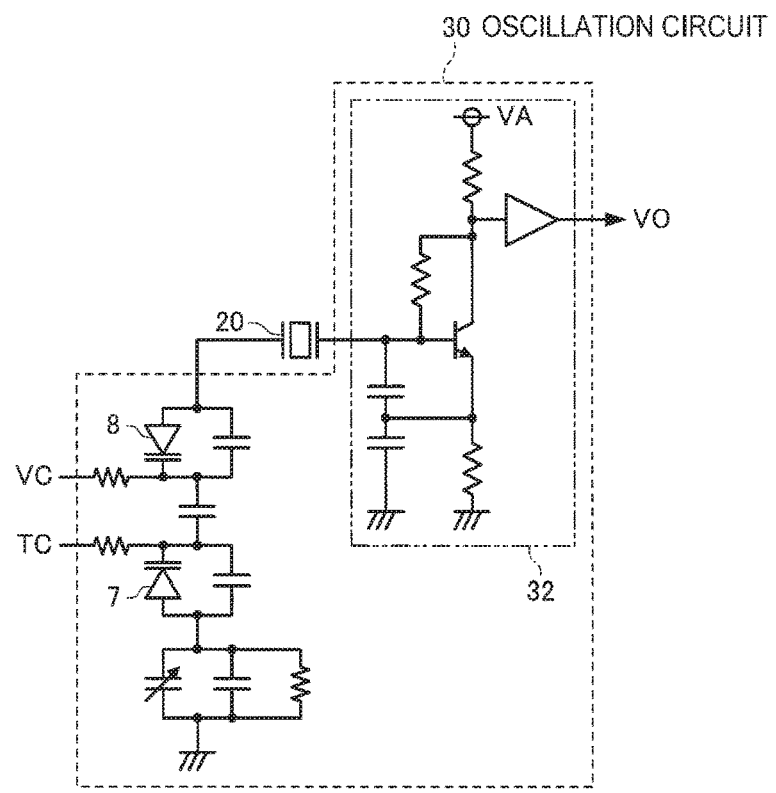
FIG. 3 is diagram illustrating a configuration example of an oscillation circuit.

FIG. 3 is a diagram illustrating a configuration example of the oscillation circuit 30. In the oscillation circuit 30 illustrated in FIG. 3, the control voltage VC is applied to one terminal of the variable capacitor element 8 (variable capacitor diode), a capacitance value of the variable capacitor element 8 changes in accordance with the voltage value, and thereby changing an oscillation frequency. In addition, the temperature compensation voltage TC is applied to one terminal of the variable capacitor element 7 (variable capacitor diode), a capacitance value of the variable capacitor element 7 changes in accordance with the voltage value, and thereby an oscillation frequency is maintained to be nearly constant regardless of temperature.

Figure 4:
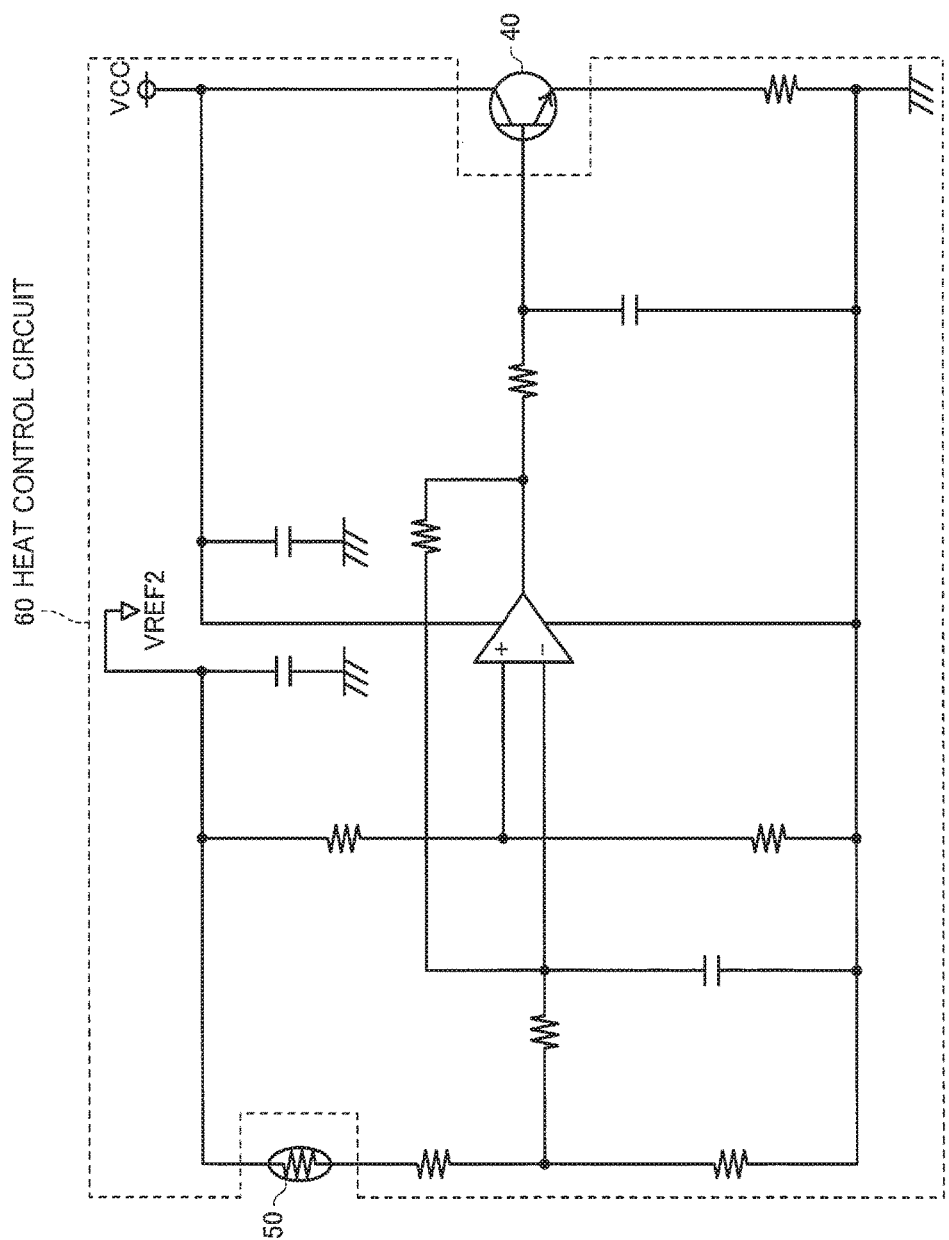
FIG. 4 is a diagram illustrating a configuration example of a temperature control circuit.

FIG. 4 is a diagram illustrating a configuration example of the heat control circuit 60. In FIG. 4, an NPN type power transistor is used for the heating element 40, and an NTC thermistor is used for the temperature sensor 50. In the heat control circuit 60 illustrated in FIG. 4, if temperature decreases, a resistance value of the temperature sensor 50 (NTC thermistor) increases, and an input potential difference of an operational amplifier increases. In contrast to this, if temperature increases, the resistance value of the temperature sensor 50 (NTC thermistor) decreases, and an input potential difference of an operational amplifier decreases. An output voltage of an operational amplifier is proportional to the input potential difference. In the heating element 40 (NPN type power transistor), if the output voltage of the operational amplifier is higher than a predetermined voltage value, a current flow by the amount of the increased voltage value, and thereby the amount of heat increases. In addition, if the output voltage of the operational amplifier is lower than the predetermined voltage value, a current does not flow, and thereby the amount of heat gradually decreases. Hence, an operation of the heating element 40 is controlled such that a resistance value of the temperature sensor 50 (NTC thermistor) becomes a desired value, that is, the heating element is maintained at a desired temperature.

In the oscillator 1 according to the present embodiment having such a configuration, the heat control circuit 60 performs a control such that the inner temperature of the thermostatic oven is maintained at a desired temperature (for example, maximum temperature, if the resonator 20 is a SC-cut crystal vibrator), based on frequency temperature characteristics of an output signal of the oscillation circuit 30 which is determined in accordance with the temperature characteristics of the resonator 20 or an IC (the D/A conversion IC 5 or the oscillation IC 6).

Figure 5:
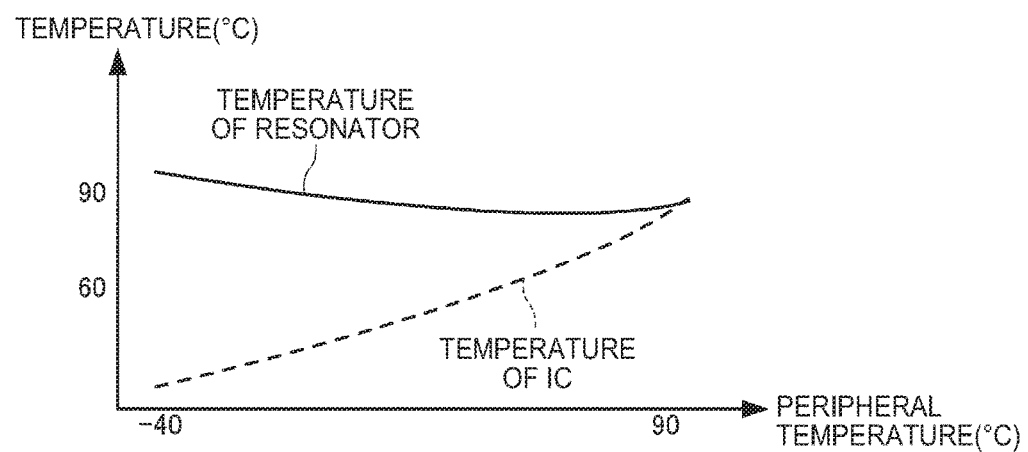
FIG. 5 is a diagram illustrating a temperature change of a vibrator and a temperature change of an IC with respect to a change of peripheral temperature.

However, in reality, the temperature of the inside of the thermostatic oven is not constant because the temperature changes depending on the peripheral temperature of the oscillator 1. FIG. 5 is a graph which illustrates a state of a temperature change of the resonator 20 and a temperature change of the IC (the D/A conversion IC 5 or the oscillation IC 6) which depend on a change of the peripheral temperature of the oscillator 1, in the oscillator 1 with the structure illustrated in FIG. 2. The resonator 20 is close to the heating element 40 and is contained in the package 23, and thus, the resonator 20 is hardly affected by peripheral temperature. However, if the peripheral temperature is changed in a range from −40° C. to 90° C., the temperature of resonator 20 is also changed slightly, as illustrated in FIG. 5. In addition, the temperature of the IC (the D/A conversion IC 5 or the oscillation IC 6) positioned near the case 2 separated from the heating element 40 is easily affected by the peripheral temperature, and thus, there is a tendency that the higher the peripheral temperature is, the higher the temperature of the IC is.

In the present embodiment, the temperature compensation circuit 10 compensates for frequency deviation which is caused by a temperature change of the resonator 20 or a temperature change of the IC that depend on a change of the peripheral temperature. Particularly, since the temperature of the IC is significantly changed depending on the change of the peripheral temperature, the temperature compensation circuit 10 is provided inside the oscillation IC 6 separately from the temperature sensor 50, and generates the temperature compensation voltage TC based on the output signal of the temperature sensor 13 which detects temperature thereof more correctly. Thus, the frequency deviation which is mainly caused by the temperature change of the IC is corrected. As a result, it is possible to realize higher frequency stability than OCXO of the related art.

Figure 6:
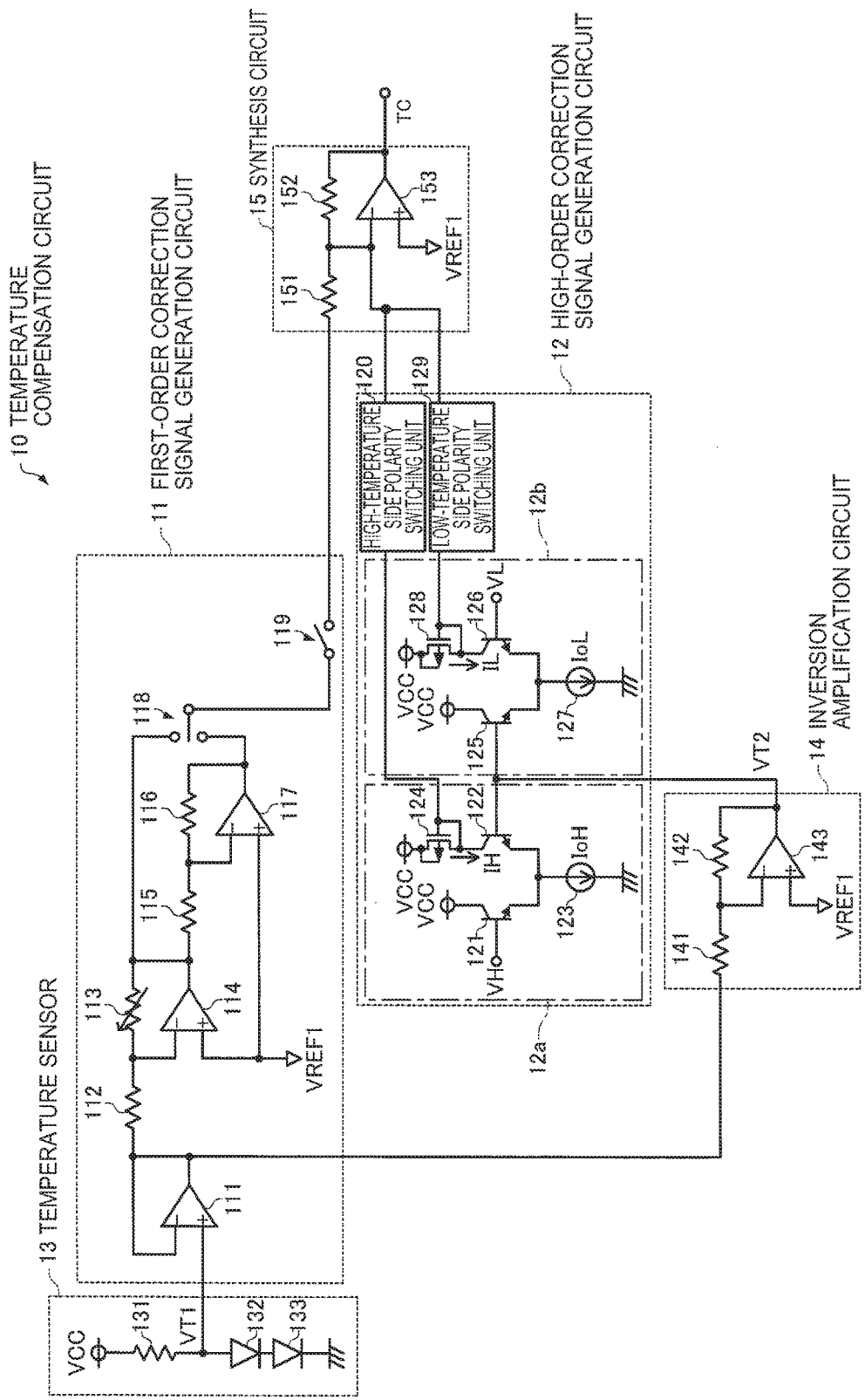
FIG. 6 is a diagram illustrating a configuration example of a temperature compensation circuit.

FIG. 6 is a diagram illustrating a configuration example of the temperature compensation circuit 10. As illustrated in FIG. 6, the temperature compensation circuit 10 is configured to include a first-order correction signal generation circuit 11 which generates a first-order correction signal for performing first-order correction, a high-order correction signal generation circuit 12 which generates a high-order correction signal for performing high-order correction, the temperature sensor 13, an inversion amplification circuit 14, and a synthesis circuit 15. However, the temperature compensation circuit 10 according to the present embodiment may have a configuration in which a part of the configuration elements illustrated in FIG. 6 is omitted or modified, or other configuration elements are added.

The temperature sensor 13 is configured to include a resistor 131 and diodes 132 and 133. The resistor 131 includes a first terminal which receives the power supply voltage VCC, and a second terminal which is connected to an anode terminal of the diode 132. In addition, a cathode terminal of the diode 132 and an anode terminal of the diode 133 are connected to each other, and a cathode terminal of the diode 133 is grounded. Thus, a signal of a connection point of the second terminal of the resistor 131 and the anode terminal of the diode 132 becomes an output voltage VT1 of the temperature sensor 13. For example, if temperature increases by 1° C., voltages of both terminals of the respective diodes 132 and 133 decrease by 2 mV. Hence, VT1 linearly changes with a negative slope with respect to a change of the inner temperature of the thermostatic oven.

The first-order correction signal generation circuit 11 is configured to include operational amplifiers 111, 114, and 117, resistors 112, 115, and 116, a variable resistor 113, and switches 118 and 119. The operational amplifier 111 includes a non-inverting input terminal (+input terminal) to which an output voltage VT1 of the temperature sensor 13 is input, and an inverting input terminal (−input terminal) and an output terminal which are both connected to a first terminal of the resistor 112. That is, the operational amplifier 111 buffers the output voltage VT1 of the temperature sensor 13 for outputting. A second terminal of the resistor 112 is connected to an inverting input terminal (−input terminal) of the operational amplifier 114 and a first terminal of the variable resistor 113. A non-inverting input terminal (+input terminal) of the operational amplifier 114 receives a reference voltage VREF1, and an output terminal of the operational amplifier 114 is connected to a second terminal of the variable resistor 113, a first terminal of the resistor 115, and a first input terminal of the switch 118. A second terminal of the resistor 115 is connected to an inverting input terminal (−input terminal) of the operational amplifier 117 and a first terminal of the resistor 116. A non-inverting input terminal (+input terminal) of the operational amplifier 117 receives the reference voltage VREF1, and an output terminal of the operational amplifier 117 is connected to a second terminal of the resistor 116 and a second input terminal of the switch 118. An output terminal of the switch 118 is connected to a first input terminal of the switch 119, and a voltage of a second terminal of the switch 119 becomes an output voltage (first-order correction voltage) of the first-order correction signal generation circuit 11. When the switch 119 is on, the first-order correction voltage linearly changes with respect to (with respect to a change of the inner temperature of the thermostatic oven) a change of the output voltage VT1 of the temperature sensor 13.

It is possible to significantly change a slope of the first-order correction voltage with respect to VT1 by changing a resistance value of the variable resistor 113. In addition, it is possible to change polarity (positive or negative) of the slope of the first-order correction voltage by switching the switch 118. Furthermore, the first-order correction voltage exhibits a high impedance constantly by switching off the switch 119 regardless of VT1, and thereby first-order temperature correction can be disabled. Information (information on on/off of the switch 119) on whether correction which is performed by the first-order correction signal generation circuit 11 is enabled or disabled, or correction parameters (information of a resistance value of 113 or connection information of the switch 118) of the first-order correction signal generation circuit 11, are stored in the storage unit 100.

The inversion amplification circuit 14 is configured to include an operational amplifier 143, and resistors 141 and 142. The resistor 141 includes a first terminal connected to an output terminal of the operational amplifier 111, and a second terminal connected to an inverting input terminal (−input terminal) of the operational amplifier 143 and a first terminal of the resistor 142. A non-inverting input terminal (+input terminal) of the operational amplifier 143 receives the reference voltage VREF1, and an output terminal of the operational amplifier 143 is connected to a second terminal of the resistor 142. Thus, an output voltage of the operational amplifier 143 becomes an output voltage VT2 of the inversion amplification circuit 14. The output voltage VT2 which is obtained by inversely amplifying the output voltage (that is, VT1) of the operational amplifier 111 by using the reference voltage VREF1 as a reference is obtained by the inversion amplification circuit 14 having the above-described configuration. Thus, VT2 linearly changes with a positive slope with respect to a change of the inner temperature of the thermostatic oven.

The high-order correction signal generation circuit 12 is configured to include a high-temperature side second-order correction signal generation circuit 12a which generates a high-temperature side second-order correction signal that performs second-order correction at a higher temperature side than temperature of a linear region of frequency temperature characteristics, a high-temperature side polarity switching circuit 120 which switches polarity of a second-order correction signal on a high side, a low-temperature side second-order correction signal generation circuit 12b which generates a low-temperature side second-order correction signal that performs second-order correction at a lower temperature side than the temperature of the linear region of the frequency temperature characteristics, and a low-temperature side polarity switching circuit 129 which switches polarity of a second-order correction signal on a low side.

The high-temperature side second-order correction signal generation circuit 12a is configured to include NPN type transistors 121 and 122, a constant current source 123, and an NMOS transistor 124 for a current mirror.

The low-temperature side second-order correction signal generation circuit 12b is configured to include NPN type transistors 125 and 126, a constant current source 127, and an NMOS transistor 128 for a current mirror.

A base terminal of the NPN type transistor 121 receives a constant reference voltage VH, a collector terminal of the NPN type transistor 121 receives the power supply voltage VCC. An emitter terminal of the NPN type transistor 121 and an emitter terminal of the NPN type transistor 122 are both connected to a first terminal of the constant current source 123, a second terminal of the constant current source 123 is grounded. A base terminal of the NPN type transistor 122 receives the output voltage VT2 of the inversion amplification circuit 14, and a collector terminal of the NPN type transistor 122 is connected to a source terminal and a gate terminal of the NMOS transistor 124. A drain terminal of the NMOS transistor 124 receives the power supply voltage VCC. A first differential amplification circuit is configured by the NPN type transistors 121 and 122, and the constant current source 123. A constant current IoH flows through the constant current source 123, and when VT2=VH, a current, which flows between an emitter and a collector of the NPN type transistor 122, becomes IH=IoH/2. Thus, in a range in which VT2 is higher than VH, IH non-linearly increases as VT2 increases (as the inner temperature of the thermostatic oven increases), and approaches IoH. Meanwhile, in a range in which VT2 is lower than VH, IH non-linearly decreases as VT2 decreases (as the inner temperature of the thermostatic oven decreases), and approaches zero.

A base terminal of the transistor 125 receives the output voltage VT2 of the inversion amplification circuit 14, and a collector terminal of the transistor 125 receives the power supply voltage VCC. An emitter terminal of the transistor 125 and an emitter terminal of the transistor 126 are both connected to a first terminal of the constant current source 127, and a second terminal of the constant current source 127 is grounded. A base terminal of the transistor 126 receives a constant reference voltage VL which is different from the reference voltage VH, and a collector terminal of the transistor 126 is connected to a source terminal and a gate terminal of the NMOS transistor 128. A drain terminal of the NMOS transistor 128 receives the power supply voltage VCC. A second differential amplification circuit is configured by the transistors 125 and 126, and the constant current source 127. A constant current IoL flows through the constant current source 127, and when VT2=VL, a current which flows between the emitter and the collector of the transistor 126 becomes IL=IoL/2. Thus, in a range in which VT2 is lower than VL, IL non-linearly increases as VT2 decreases (as the inner temperature of the thermostatic oven decreases), and approaches IoH. Meanwhile, in a range in which VT2 is higher than VL, IL non-linearly decreases as VT2 increases (as the inner temperature of the thermostatic oven increases), and approaches zero.

Figure 7:
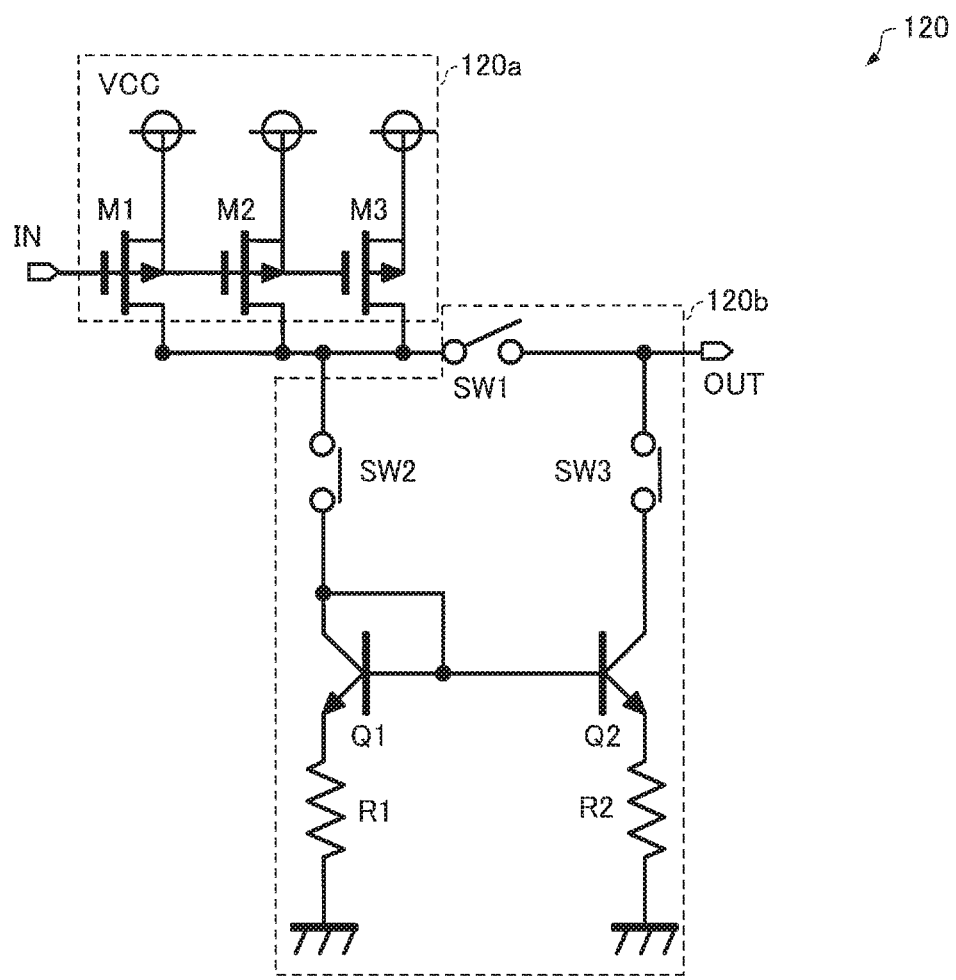
FIG. 7 is a diagram illustrating a configuration example of a high temperature side polarity switching circuit.

FIG. 7 is a diagram illustrating a configuration example of the high-temperature side polarity switching circuit 120. A configuration of the low-temperature side polarity switching circuit 129 is also the same as that of the high-temperature side polarity switching circuit 120.

In the example illustrated in FIG. 7, the high-temperature side polarity switching circuit 120 is configured to include a gain switching unit 120a and a polarity switching unit 120b.

The gain switching unit 120a is configured to include the NMOS transistors M1 to M3. Gate terminals of the NMOS transistors M1 to M3 are commonly connected to each other, and are connected to the gate terminal of the NMOS transistor 124. Drain terminals of the NMOS transistors M1 to M3 are commonly connected to each other, and receive the power supply voltage VCC. Source terminals of the NMOS transistors M1 to M3 are commonly connected to each other, and are connected to one terminal of a switch SW1 and one terminal of a switch SW2 of the polarity switching unit 120b. A current which is proportional to the current IH flows through the NMOS transistors M1 to M3. A mirror ratio of currents can be changed by disabling or enabling the NMOS transistors M1 to M3 using a switch or the like which is not illustrated, and thus, it is possible to switch the gain of a high-temperature side second-order correction signal.

The polarity switching unit 120b is configured to include transistors Q1 and Q2 which are NPN transistors, switches SW1 to SW3, and resistors R1 and R2. A collector terminal of the transistor Q1 is connected to the other terminal of the switch SW2, and is connected to base terminals of the transistor Q1 and the transistor Q2. An emitter terminal of the transistor Q1 is connected to a ground potential through the resistor R1. A collector terminal of the transistor Q2 is connected to one terminal of the switch SW3. An emitter terminal of the transistor Q2 is connected to the ground potential through the resistor R2. The other terminal of the switch SW1 and the other terminal of the switch SW3 are commonly connected to each other, and become an output terminal which is connected to the synthesis circuit 15.

If the switch SW1 of the polarity switching unit 120b is ON and the switches SW2 and SW3 thereof are OFF, the polarity switching unit 120b outputs an output current of the gain switching unit 120a to the synthesis circuit 15 as it is. Meanwhile, if the switch SW1 of the polarity switching unit 120b is OFF and the switches SW2 and SW3 thereof are ON, the polarity switching unit 120b outputs a current in a direction opposite to the output current of the gain switching unit 120a to the synthesis circuit 15. Hence, by switching the switches SW1 to SW3, polarity of a high-temperature side second-order correction signal can be switched.

Returning to FIG. 6, the synthesis circuit 15 synthesizes a first-order correction signal and the high-order correction signal. In the example illustrated in FIG. 6, the synthesis circuit 15 is configured to include an operational amplifier 153, and resistors 151 and 152. The resistor 151 includes a first terminal which is connected to a second terminal of the switch 119, and a second terminal which is connected to an inverting input terminal (−input terminal) of the operational amplifier 153, a first terminal of the resistor 152, an output terminal of the high-temperature side polarity switching circuit 120, and an output terminal of the low-temperature side polarity switching circuit 129. A non-inverting input terminal (+input terminal) of the operational amplifier 153 receives the reference voltage VREF1, and an output terminal of the operational amplifier 153 is connected to a second terminal of the resistor 152. Thus, an output voltage of the operational amplifier 153 becomes an output voltage of the synthesis circuit 15. The synthesis circuit 15 having the above-described configuration outputs a voltage which is obtained by adding the output voltage (first-order correction signal) of the first-order correction signal generation circuit 11 to the output voltage (high-order correction signal) of the high-order correction signal generation circuit 12, and the voltage which is output from the synthesis circuit becomes the temperature compensation voltage TC which is the output voltage of the temperature compensation circuit 10.

If the outer temperature increases, the inner temperature of the thermostatic oven also increases slightly, and if the outer temperature decreases, the inner temperature of the thermostatic oven also decreases slightly. For example, in a case in which the inner temperature of the thermostatic oven is set to temperature (for example, 90° C.) in which a frequency of the oscillator 1 is maximum, if the inner temperature of the thermostatic oven is equal to the set temperature when the outer temperature is reference temperature (for example, 25° C.), frequency deviation decreases in a temperature range (for example, −30° C. to 85° C.) of a guaranteed operation of the oscillator 1, even though the inner temperature of the thermostatic oven is slightly changed (in a range of, for example, 88° C. to 92° C.). However, if the inner temperature of the thermostatic oven is shifted from the set temperature when the outer temperature is the reference temperature (for example, 25° C.), the frequency deviation increases near (for example, approximately −30° C. or approximately 85° C.) ends of a guaranteed operation temperature range (for example, −30° C. to 85° C.). Hence, the temperature compensation circuit 10 effectively reduces the frequency deviation near the ends of the guaranteed operation temperature range using the second-order temperature correction.

Figure 8A:
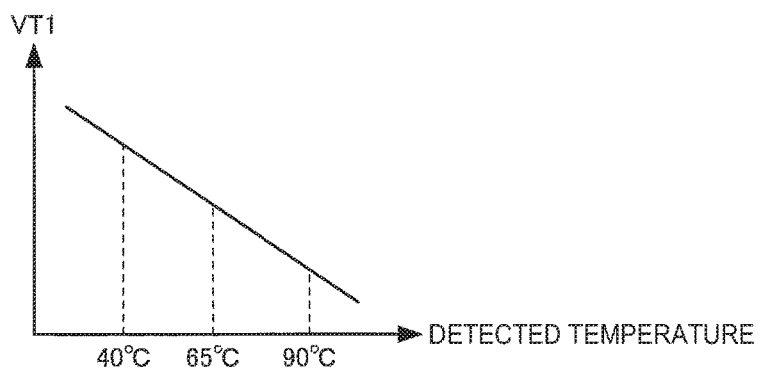
FIGS. 8A to 8D are explanatory diagrams for second-order temperature correction.
Figure 8B:
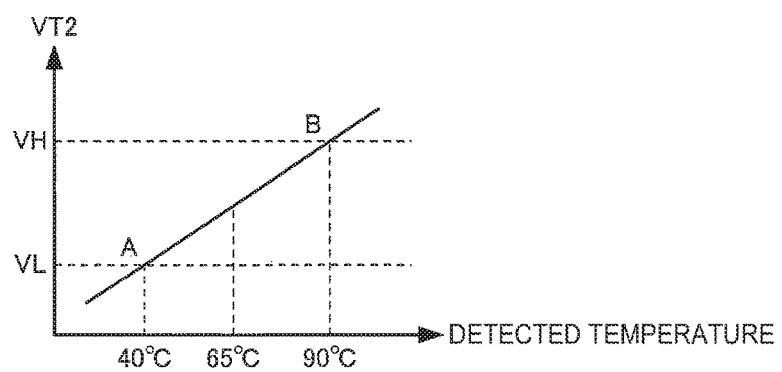
Figure 8C:
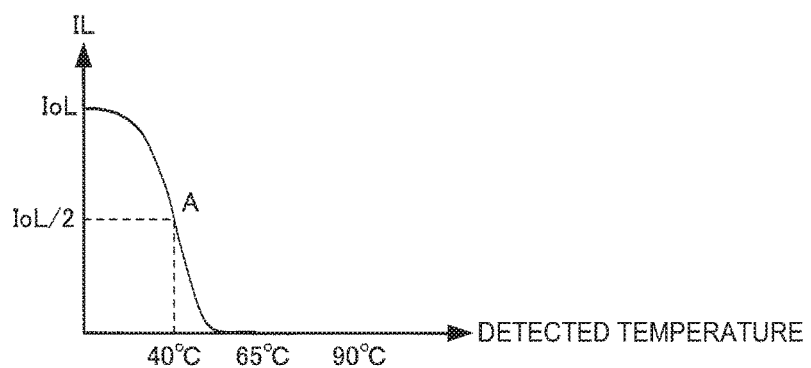
Figure 8D:
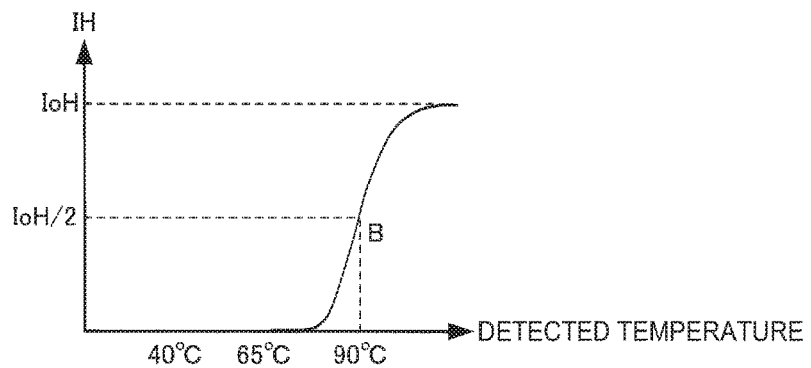

FIG. 8A to FIG. 11B are diagrams illustrating second-order temperature correction according to the present embodiment. As illustrated in FIG. 8A, VT1 changes with a negative slope with respect to a change in a range of 40° C. to 90° C. of temperature (hereinafter, simply referred to as "detected temperature) detected by the temperature sensor 13. As illustrated in FIG. 8B, VT2 changes with a positive slope with respect to a change in a range of 40° C. to 90° C. of the detected temperature. Here, for example, the slope is adjusted such that VT2=VL when the detected temperature is 40° C. and VT2=VH when the detected temperature is 90° C. By doing so, IL=IoL/2 when the detected temperature is 40° C., and IL non-linearly increases when the detected temperature is approximately 40° C. if the detected temperature decreases, as illustrated in FIG. 8C. When the detected temperature is 65° C. or 90° C., IL≅0. In addition, IH=IoH/2 when the detected temperature is 90° C., and IH non-linearly increases when the detected temperature is approximately 90° C. if the detected temperature increases, as illustrated in FIG. 8D. When the detected temperature is 65° C. or 40° C., IH≅0. Hence, the second-order correction voltage is determined by IL on a low temperature side and is determined by IH on a high temperature side.

Figure 9A:
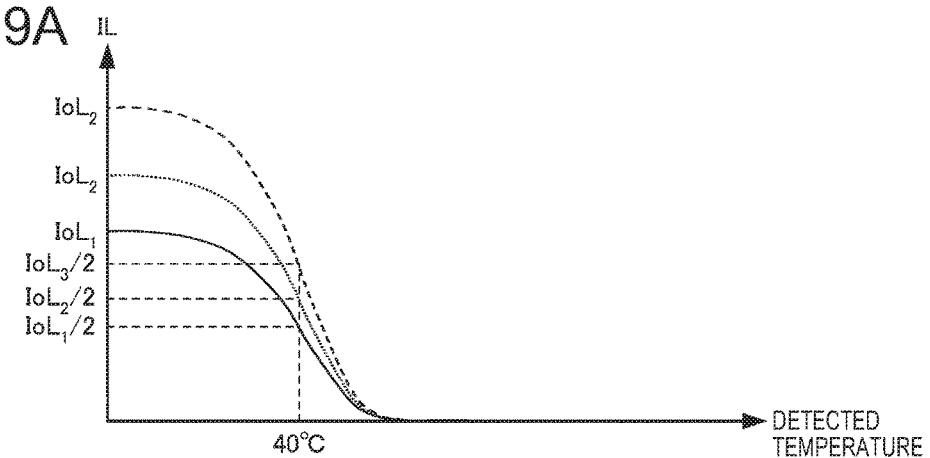
FIGS. 9A and 9B are explanatory diagrams for the second-order temperature correction.
Figure 9B:
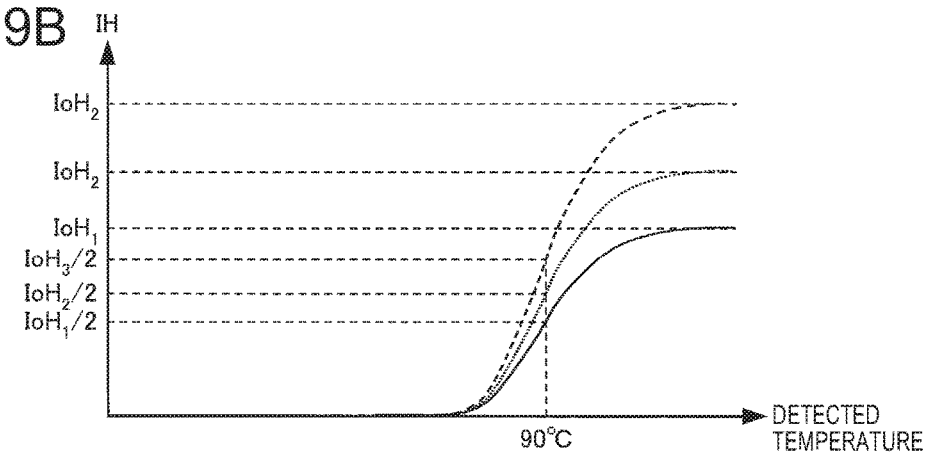

Then, as illustrated in FIG. 9A, as the current IoL flowing through the constant current source 127 is changed, the slope of IL can be changed with respect to a change of the detected temperature. Specifically, as IoL increases, the slope of IL is made to be steeper. In the same manner, as illustrated in FIG. 9B, as the current IoH flowing through the constant current source 123 is changed, the slope of IH can be changed with respect to a change of the detected temperature. Specifically, as IoH increases, the slope of IH is steepened. Hence, frequency temperature characteristics of the output signal of the oscillation circuit 30 is measured, IoL or IoH is adjusted such that a decrease of the frequency at a low temperature side or high temperature side is corrected, and thus, it is possible to effectively reduce second-order components of the frequency deviation.

Figure 10A:
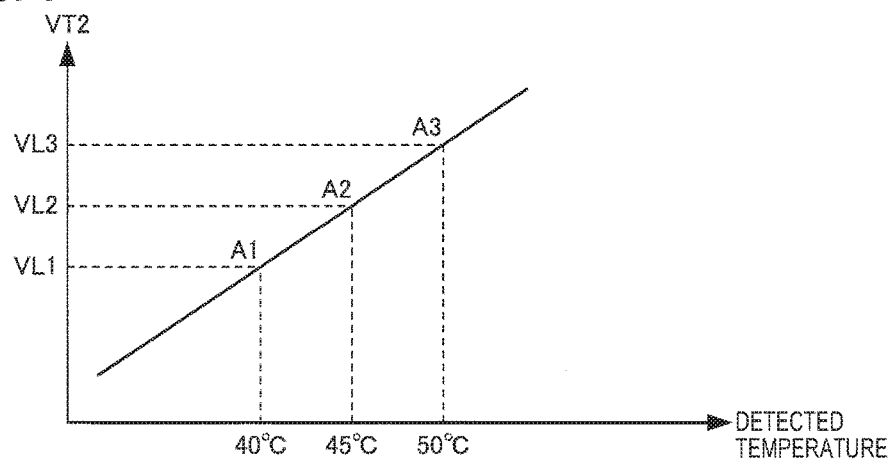
FIGS. 10A and 10B are explanatory diagrams for the second-order temperature correction.
Figure 10B:
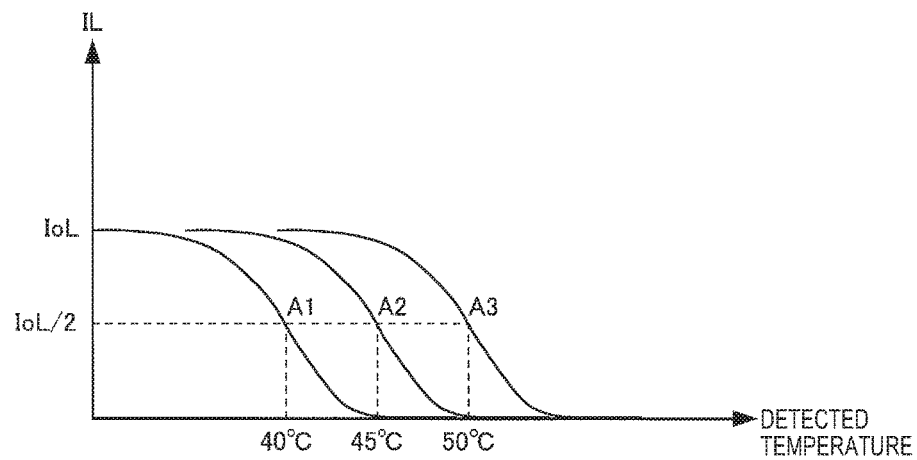
Figure 11A:
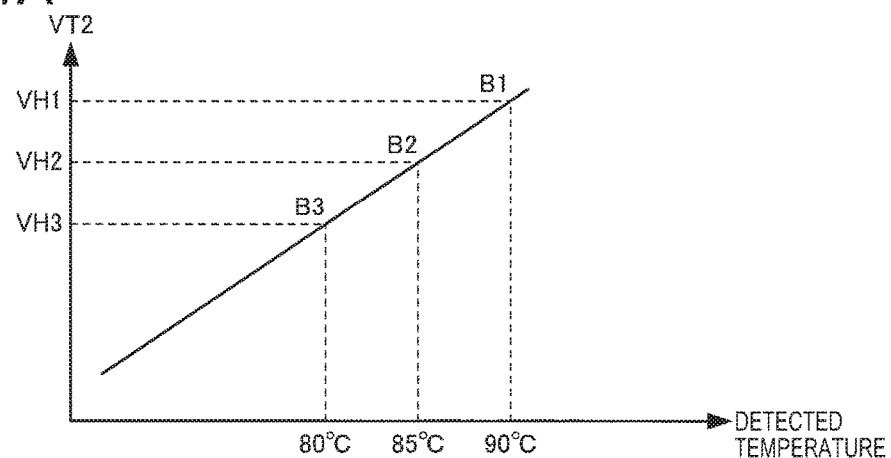
FIGS. 11A and 11B are explanatory diagrams for the second-order temperature correction.
Figure 11B:
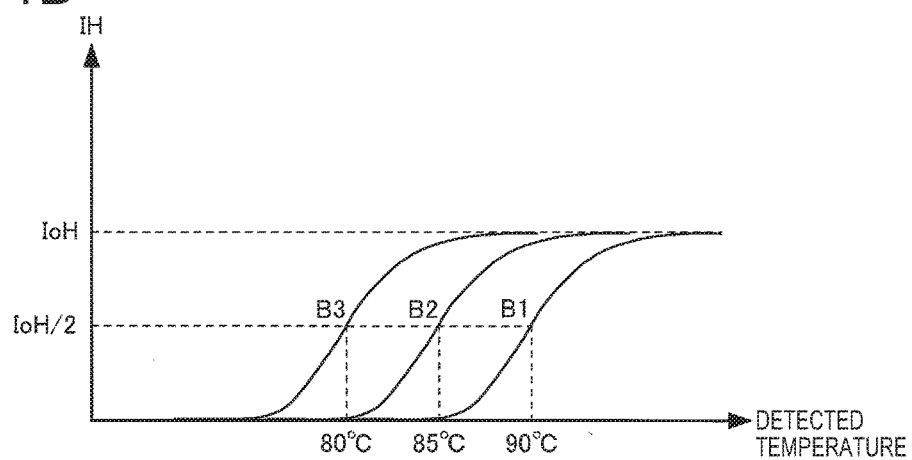

The guaranteed operation temperature range of the oscillator 1 changes depending on usage, and thus, second-order temperature correction according to the guaranteed operation temperature range is required. Hence, the temperature compensation circuit 10 changes the reference voltage VL or VH, thereby being able to change the detected temperature in which IL=IoL/2 or the detected temperature in which IH=IoH/2. For example, if VT2 becomes VL1, VL2, or VL3 when the detected temperature is 40° C., 45° C., or 50° C., as illustrated in FIG. 10A, the voltage is set to VL=VL1, VL2, or VL3, as illustrated in FIG. 10B, and thus, IL=IoL/2 when the detected temperature is 40° C., 45° C., or 50° C. In the same manner, for example, if VT2 becomes VH1, VH2, or VH3 when the detected temperature is 90° C., 85° C., or 80° C., as illustrated in FIG. 11A, the voltage is set to VH=VH1, VH2, or VH3, as illustrated in FIG. 11B, and thus, IH=IoH/2 when the detected temperature is 90° C., 85° C., or 80° C. Hence, the reference voltage VL or VH is adjusted in accordance with the guaranteed operation temperature range, and thus, it is possible to effectively reduce the second-order components of the frequency deviation.

Furthermore, polarity of the high-order correction signal is switched by the high-temperature side polarity switching circuit 120 and the low-temperature side polarity switching circuit 129, and thus, it is possible to correct second-order characteristics in a reverse direction, or pseudo third-order characteristics.

Correction parameters (information on IoL, IoH, VL, and VH, or information on polarity) of the high-order correction signal generation circuit 12 are stored in the storage unit 100.

The oscillator 1 according to the first embodiment described above is a novel thermostatic oven type oscillator which can control an oscillation frequency in accordance with a digital signal that is input from an external terminal. Particularly, in the oscillator 1 according to the present embodiment, a voltage which is obtained by adding the control voltage VC that is output from the D/A conversion circuit 80 to the temperature compensation voltage TC that is output from the temperature compensation circuit 10 is not applied to one variable capacitor element, the control voltage VC and the temperature compensation voltage TC are respectively applied to the variable capacitor element 8 and the variable capacitor element 7 which are different from each other, and thus, the frequency of the oscillation circuit 30 is controlled. As a result, a part of a voltage range of the output of the D/A conversion circuit 80 need not be assigned for temperature compensation, and a full voltage range of the output of the D/A conversion circuit 80 can be assigned for a frequency control range. Hence, according to the oscillator 1 of the present embodiment, it is possible to widen a frequency control range while maintaining resolution of the frequency control, or to increase the resolution of the frequency control while maintaining the frequency control range. In this way, according to the present embodiment, it is possible to realize the oscillator 1 which can perform temperature compensation without narrowing the frequency control range.

1-2. Second Embodiment

Figure 12:
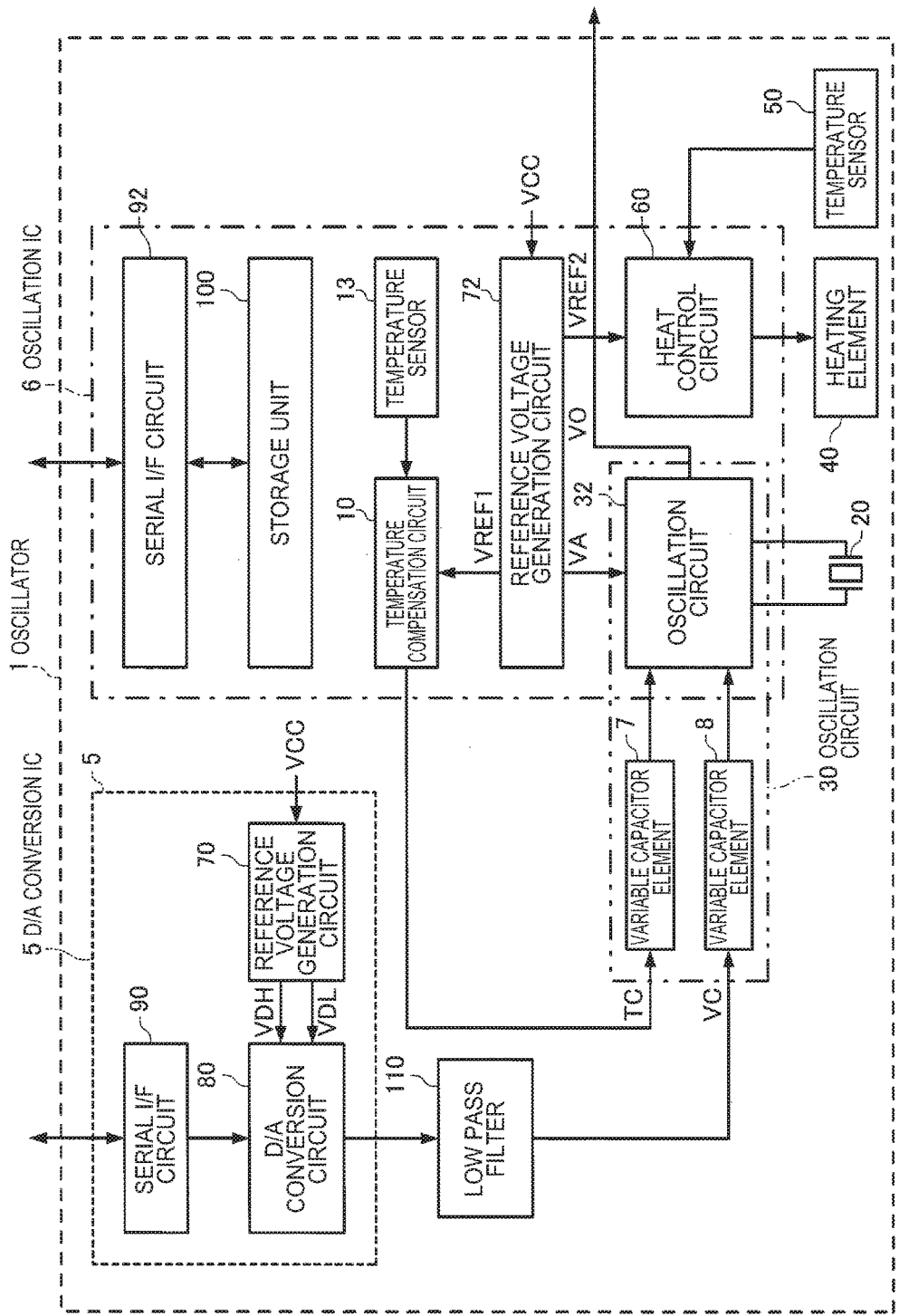
FIG. 12 is a functional block diagram of an oscillator according to a second embodiment.

FIG. 12 is an example of a functional block diagram of an oscillator according to a second embodiment. In FIG. 12, the same symbols or reference numerals will be attached to the same configuration elements as in FIG. 1. A sectional diagram of the oscillator according to the second embodiment is the same as that of FIG. 2, and thus, illustration thereof will be omitted. As illustrated in FIG. 12, the oscillator 1 according to the second embodiment includes the resonator 20, the D/A conversion integration circuit (IC) 5, the oscillation integrated circuit (IC) 6, the variable capacitor element 7, the variable capacitor element 8, the heating element 40 which heats the resonator 20, and the temperature sensor 50, in the same manner as in the first embodiment, and furthermore, is configured to include a low pass filter 110. The oscillator 1 according to the second embodiment may have a configuration in which a part of the configuration elements illustrated in FIG. 12 is omitted or modified, or other configuration elements are added.

The low pass filter 110 is connected between the D/A conversion circuit 80 and the variable capacitor element 8, and an output voltage of the D/A conversion circuit 80 is applied to the variable capacitor element 8 through the low pass filter 110. The low pass filter 110 is realized by, for example, an RC low pass filter which is configured by a resistor (R) and a capacitor (C), an LC low pass filter which is configured by a coil (L) and a capacitor (C), an active low pass filter which uses an operational amplifier, or the like. Each element which configures the low pass filter 110 corresponds to the electronic component 9 of FIG. 2.

Other configurations of the oscillator 1 according to the second embodiment are the same as the oscillator 1 according to the first embodiment, and thus, description thereof will be omitted.

Noise which overlaps the control voltage VC that is applied to the variable capacitor element 8 has high frequency sensitivity, and is a major factor contributing to degradation of frequency accuracy. For this reason, in the second embodiment, switching noise (noise which is generated when a data signal of N bits (digital data for controlling a frequency of the oscillation circuit 30)) which is generated in the D/A conversion circuit 80 and overlaps the output voltage of the D/A conversion circuit 80, or quantization noise, is attenuated by the low pass filter 110, thereby reducing noise which overlaps the control voltage VC. Hence, according to the oscillator 1 according to the second embodiment, it is possible to increase frequency accuracy of the output signal of the oscillation circuit 30, and to realize high frequency stability.

1-3. Third Embodiment

Figure 13:
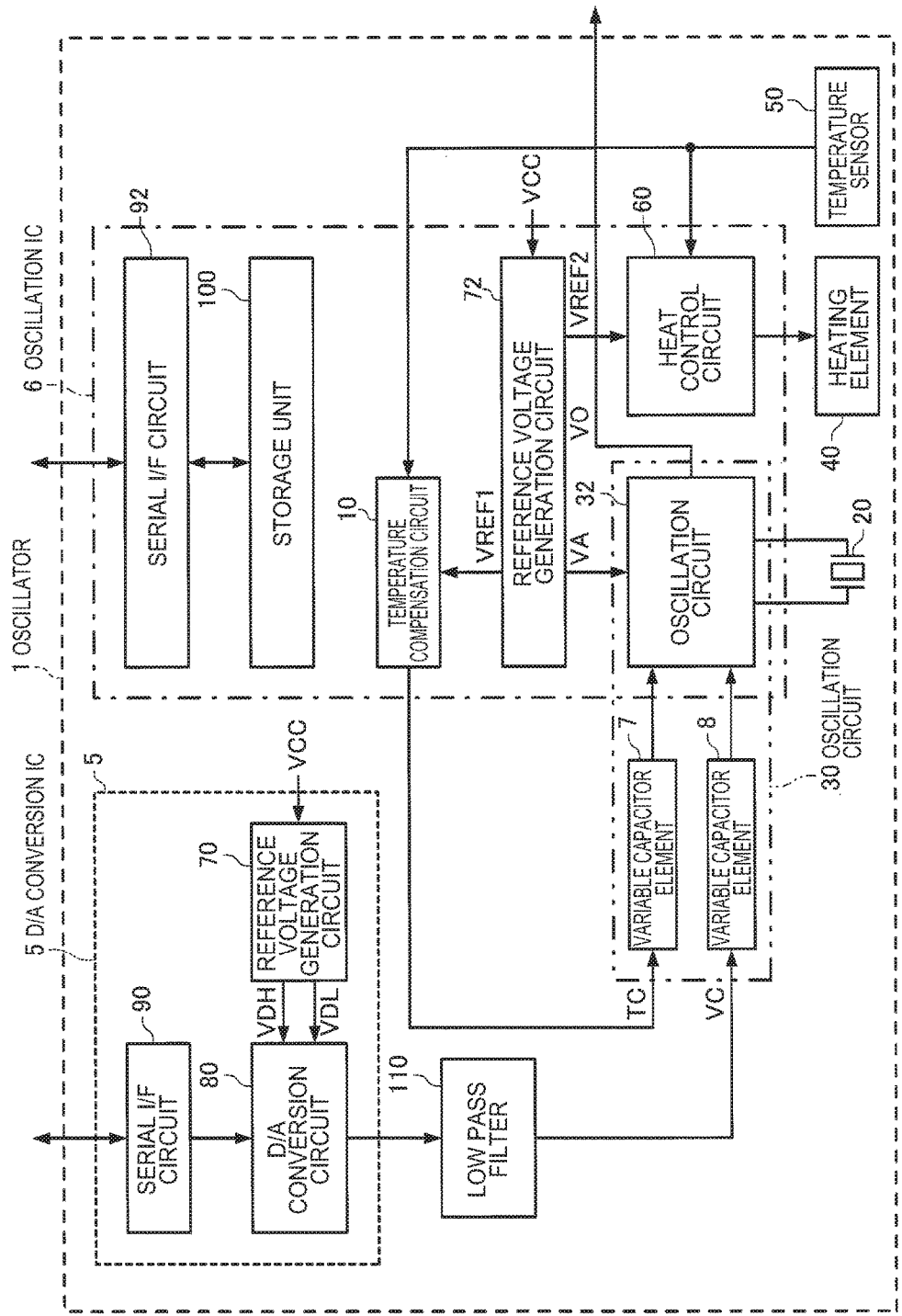
FIG. 13 is a functional block diagram of an oscillator according to a third embodiment.
Figure 14:
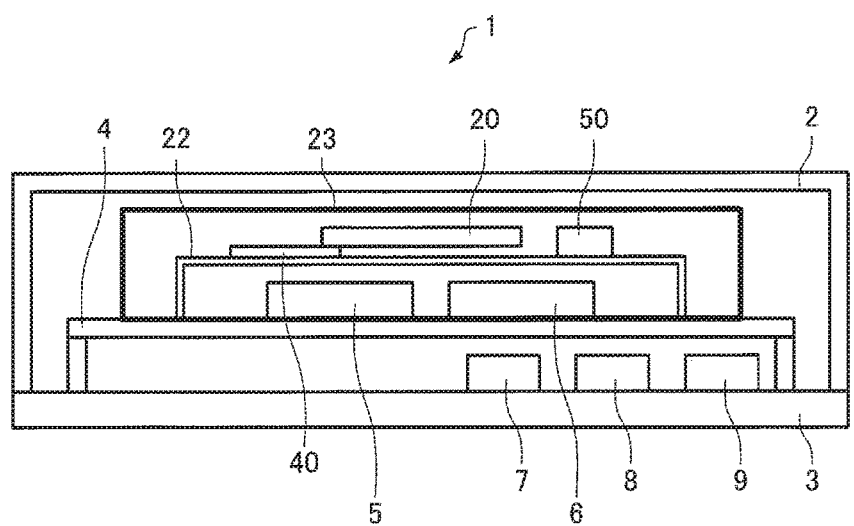
FIG. 14 is a sectional diagram of the oscillator according to the third embodiment.

FIG. 13 is an example of a functional block diagram of an oscillator according to a third embodiment. In addition, FIG. 14 is an example of a sectional diagram of the oscillator according to the third embodiment. In FIGS. 13 and 14, the same symbols or reference numerals will be attached to the same configuration elements as in FIG. 1 and FIG. 2.

As illustrated in FIG. 13, the oscillator 1 according to the third embodiment is configured to include the resonator 20, the D/A conversion integration circuit (IC) 5, the oscillation integrated circuit (IC) 6, the variable capacitor element 7, the variable capacitor element 8, the heating element 40 which heats the resonator 20, the temperature sensor 50 (an example of a first temperature sensor), and the low pass filter 110, in the same manner as in the second embodiment. The oscillator 1 according to the third embodiment may have a configuration in which a part of the configuration elements illustrated in FIG. 13 is omitted or modified, or other configuration elements are added.

As illustrated in FIG. 14, the oscillator 1 according to the third embodiment includes the variable capacitor element 7, the variable capacitor element 8, and other one or more electronic components 9 (resistor, capacitor, coil, or the like) which are mounted on an upper surface of the component mounting substrate 3. In addition, the component mounting substrate 4 is provided to face the component mounting substrate 3. The component mounting substrate 22, the heating element 40 provided on an upper surface of the component mounting substrate 22, the resonator 20 mounted in a part of an upper surface of the heating element 40, the D/A conversion IC 5 and the oscillation IC 6 which are provided to face a lower surface of the component mounting substrate 22, and the package 23 (for example, ceramic package) in which the temperature sensor 50 is contained, are mounted on an upper surface of the component mounting substrate 4.

Figure 15:
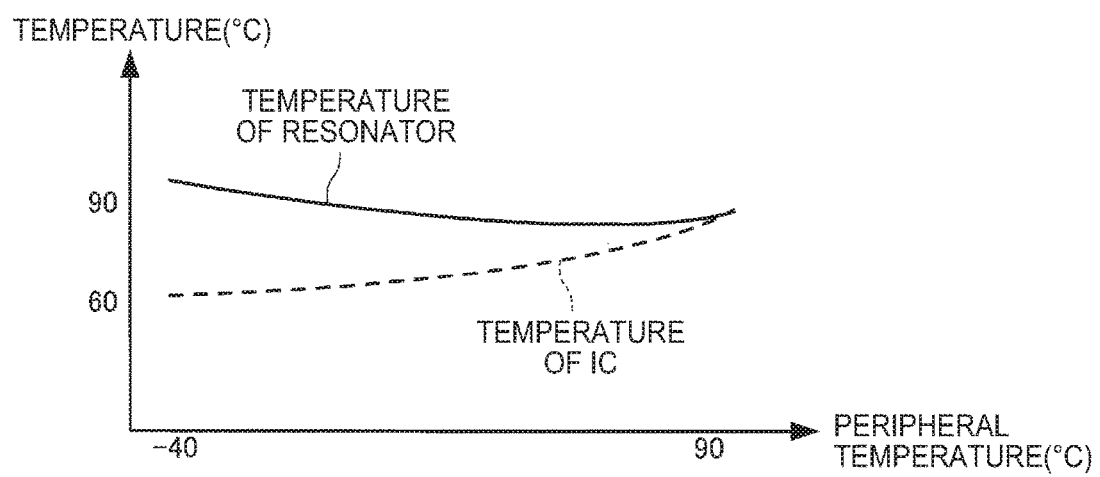
FIG. 15 is a diagram illustrating a temperature change of a vibrator and a temperature change of an IC with respect to a change of peripheral temperature.

In the oscillator 1 according to the third embodiment, the IC (the D/A conversion IC 5 or the oscillation IC 6) is contained in the package 23, and thus, the IC is barely affected by peripheral temperature, compared to the oscillator 1 (FIG. 5) according to the first embodiment or the second embodiment. FIG. 15 is a diagram illustrating a state of a temperature change of the resonator 20 and a temperature change of the IC (the D/A conversion IC 5 or the oscillation IC 6) according to a change of the peripheral temperature of the oscillator 1, in the oscillator 1 according to the third embodiment. As illustrated in FIG. 15, in the oscillator 1 according to the third embodiment, a temperature change of the IC according to a change of the peripheral temperature of the oscillator 1 is small and a temperature difference between the IC and the resonator 20 is small, compared to the oscillator 1 (FIG. 5) according to the first embodiment or the second embodiment.

Accordingly, as illustrated in FIG. 13, in the oscillator 1 according to the third embodiment, the temperature sensor 13 is not provided in the oscillation IC 6, and the temperature compensation circuit 10 is connected to the temperature sensor 50, differently from the oscillator 1 according to the first embodiment or the second embodiment. That is, in the oscillator 1 according to the third embodiment, the temperature sensor 50 is used for both a heat control which is performed by the heat control circuit 60 and temperature compensation which is performed by the temperature compensation circuit 10 because a temperature difference between the IC and the resonator 20 is small, and thus, the oscillation IC 6 is miniaturized. There is a small difference between the temperature (temperature of the resonator 20) which is detected by the temperature sensor 50 and the actual temperature of an IC, but the difference is included in a range in which sufficient temperature compensation can be made by the temperature compensation circuit 10. Hence, according to the oscillator 1 of the third embodiment, it is possible to reduce manufacturing costs and to achieve miniaturization, while realizing high frequency stability.

2. Electronic Apparatus

Figure 16:
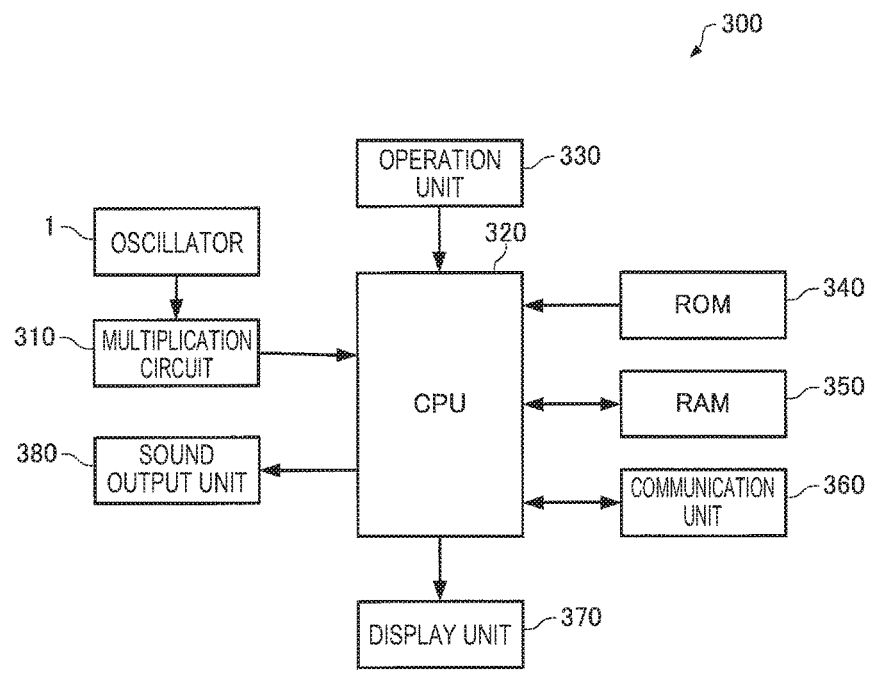
FIG. 16 is a functional block diagram illustrating an example of a configuration of an electronic apparatus according to an embodiment.

FIG. 16 is a functional block diagram of an electronic apparatus 300 according to the present embodiment. The same symbols or reference numerals will be attached to the same configurations as in the respective embodiments described above, and description thereof will be omitted.

The electronic apparatus 300 according to the present embodiment is the electronic apparatus 300 including the oscillator 1. In an example illustrated in FIG. 16, the electronic apparatus 300 is configured to include the oscillator 1, a multiplication circuit 310, a central processing unit (CPU) 320, an operation unit 330, a read only memory (ROM) 340, a random access memory (RAM) 350, a communication unit 360, a display unit 370, and a sound output unit 380. The electronic apparatus 300 according to the present embodiment may have a configuration in which a part of the configuration elements (each unit) illustrated in FIG. 16 is omitted or modified, or other configuration elements are added.

The multiplication circuit 310 supplies a clock pulse to not only the CPU 320 but also each unit (not illustrated). The clock pulse may be a signal which is obtained by extracting a desired harmonic signal from an oscillation signal from the oscillator 1 using the multiplication circuit 310, and may be a signal which is obtained by multiplying the oscillation signal from the oscillator 1 using the multiplication circuit 310 including a PLL synthesizer (not illustrated).

The CPU 320 performs various calculation processing or control processing using a clock pulse which is output from the multiplication circuit 310 in accordance with a program stored in the ROM 340 or the like. Specifically, the CPU 320 performs various processing according to an operation signal from the operation unit 330, processing of controlling the communication unit 360 for performing data communication with an external device, processing of transmitting a display signal for displaying various information on the display unit 370, processing of outputting various sounds to the sound output unit 380, or the like.

The operation unit 330 is an input device which is configured by operation keys, button switches, or the like, and outputs an operation signal according to an operation of a user to the CPU 320.

The ROM 340 stores a program, data, or the like which is necessary for the CPU 320 to perform various calculation processing or control processing.

The RAM 350 is used as a work area of the CPU 320 and temporarily stores a program or data which is read from the ROM 340, data which is input from the operation unit 330, arithmetic results which are obtained by implementing various programs using the CPU 320, or the like.

The communication unit 360 performs various controls for performing data communication between the CPU 320 and an external device.

The display unit 370 is configured by a liquid crystal display (LCD), an electrophoretic display, or the like, and displays various information based on a display signal which is input from the CPU 320.

In addition, the sound output unit 380 is a device which outputs a sound, such as a speaker.

The electronic apparatus 300 according to the present embodiment includes the oscillator 1 which controls an oscillation frequency in accordance with digital data and can perform temperature compensation without narrowing a frequency control range, and thus, it is possible to realize the electronic apparatus 300 with higher reliability.

Various electronic apparatuses can be used for the electronic apparatus 300. For example, a personal computer (for example, a mobile personal computer, a laptop personal computer, or a tablet personal computer), a mobile terminal such as a cellular phone, a digital camera, an ink jet ejecting device (for example, an ink jet printer), a storage area network device such as a router or a switch, a local area network apparatus, an apparatus for a moving object terminal base station, a television, a video camera, a video recorder, a car navigation device, a pager, an electronic notebook (including communication function), an electronic dictionary, an electronic calculator, an electronic game apparatus, a game controller, a word processor, a workstation, a video phone, a security television monitor, electronic binoculars, a point of sale (POS) terminal, a medical apparatus (for example, an electronic thermometer, a blood pressure meter, a blood glucose meter, an electrocardiogram measurement device, an ultrasonic diagnostic device, or an electronic endoscope), a fish finder, various measurement apparatuses, various instruments (for example, instruments of a vehicle, an aircraft, or a ship), a flight simulator, a head-mounted display, a motion tracer, a motion tracking device, a motion controller, a PDR (pedestrian position orientation measurement), or the like can be used for the electronic apparatus.

Figure 17:
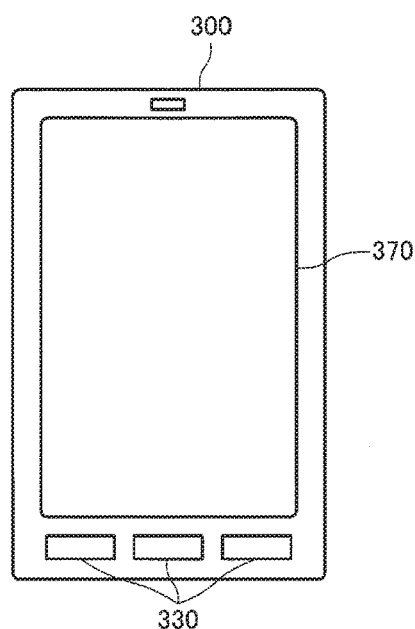
FIG. 17 is a view illustrating an example of an appearance of the electronic apparatus according to the embodiment.

FIG. 17 is a view illustrating an example of an appearance of a smart phone which is an example of the electronic apparatus 300. The smart phone which is the electronic apparatus 300 includes buttons as the operation unit 330, and an LCD as the display unit 370. In addition, the smart phone which is the electronic apparatus 300 includes the oscillator 1 with high frequency stability, and thus, it is possible to realize the electronic apparatus 300 with higher reliability.

3. Moving Object

Figure 18:
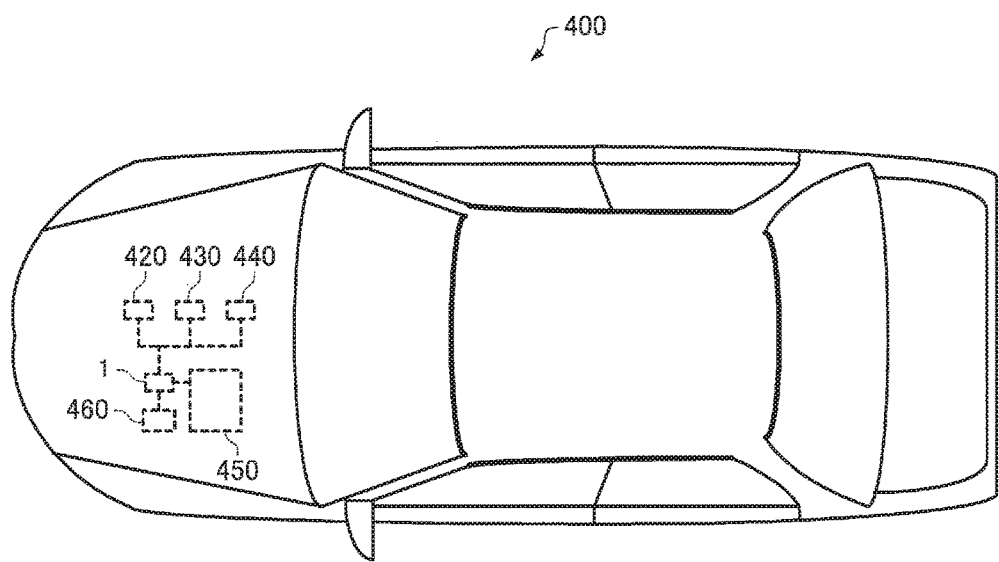
FIG. 18 is a view illustrating an example of a moving object according to the embodiment.

FIG. 18 is a view (top view) illustrating an example of a moving object 400 according to the present embodiment. The same symbols or reference numerals will be attached to the same configurations as in the respective embodiments described above, and description thereof will be omitted.

The moving object 400 according to the present embodiment is the moving object 400 which includes the oscillator 1. In the example illustrated in FIG. 18, the moving object 400 is configured to include a controller 420 which performs various controls for an engine system, a brake system, a keyless entry system, and the like, a controller 430, a controller 440, a battery 450, and a battery 460 for backup power. The moving object 400 according to the present embodiment may have a configuration in which a part of the configuration elements (each unit) illustrated in FIG. 18 is omitted or modified, or other configuration elements are added.

The moving object 400 according to the present embodiment includes the oscillator 1 which controls an oscillation frequency in accordance with digital data and can perform temperature compensation without narrowing a frequency control range, and thus, it is possible to realize the moving object 400 with higher reliability.

Various moving objects can be used for the above-described moving object 400, and for example, an automobile (including electric vehicles), an aircraft such as a jet or a helicopter, a ship, a rocket, a satellite, or the like can be used as the moving object.

The invention is not limited to the present embodiment, and various modifications can be implemented within a range of the gist of the invention.

For example, the oscillator according to the above-described embodiments is a thermostatic oven type oscillator, but the invention is not limited to the thermostatic oven type oscillator, and can be applied to an oscillator (voltage controlled temperature compensated crystal oscillator (VCTCXO) or the like) with a temperature compensation function and a frequency control function according to a digital input.

The above-described embodiments are only examples, and the invention is not limited to the embodiments. For example, the respective embodiments can also be appropriately combined with each other.

The invention includes substantially the same configuration (for example, function, configuration in which a method or effects are the same, or configuration in which objective and results are the same) as the configuration described in the embodiments. In addition, the invention includes a configuration in which a section is replaced which is not essential in the configuration described in the embodiments. In addition, the invention includes a configuration in which the same action effects as in the configuration described in the embodiments are obtained, or a configuration in which the same objective can be achieved. In addition, the invention includes a configuration in which a known technology is added to the configuration described in the embodiments.

The entire disclosure of Japanese Patent Application No. 2015-052183, filed Mar. 16, 2015 is expressly incorporated by reference herein.

What is claimed is:

1. An oscillator comprising:
    a resonator;
    an oscillation circuit which oscillates the resonator and includes a first variable capacitor element and a second variable capacitor element;
    a reference voltage generation circuit that generates a first reference voltage and a second reference voltage;
    a D/A conversion circuit which receives digital data, the first reference voltage, and the second reference voltage for controlling a frequency of the oscillation circuit;

a first temperature sensor; and a temperature compensation circuit which is connected to the first temperature sensor, wherein an output voltage of the D/A conversion circuit is applied to the first variable capacitor element, and wherein an output voltage of the temperature compensation circuit is applied to the second variable capacitor element.

2. The oscillator according to claim 1, further comprising:
a second temperature sensor which detects temperature of the resonator;
a heating element for heating the resonator; and
a heat control circuit which controls the heating element on the basis of an output signal of the second temperature sensor.

3. The oscillator according to claim 1, further comprising:
a heating element for heating the resonator; and
a heat control circuit which controls the heating element on the basis of an output signal of the first temperature sensor,
wherein the first temperature sensor detects temperature of the resonator.

4. The oscillator according to claim 1, further comprising:
a low pass filter,
wherein an output voltage of the D/A conversion circuit is applied to the first variable capacitor element through the low pass filter.

5. The oscillator according to claim 2, further comprising:
a low pass filter,
wherein an output voltage of the D/A conversion circuit is applied to the first variable capacitor element through the low pass filter.

6. The oscillator according to claim 3, further comprising:
a low pass filter,
wherein an output voltage of the D/A conversion circuit is applied to the first variable capacitor element through the low pass filter.

7. An electronic apparatus comprising:
the oscillator according to claim 1.

8. An electronic apparatus comprising:
the oscillator according to claim 2.

9. An electronic apparatus comprising:
the oscillator according to claim 3.

10. A moving object comprising:
the oscillator according to claim 1.

11. A moving object comprising:
the oscillator according to claim 2.

12. A moving object comprising:
the oscillator according to claim 3.

13. A moving object comprising:
the oscillator according to claim 4.

14. The oscillator of claim 1, further comprising a first interface circuit that receives data signals and outputs the digital data to the D/A conversion circuit for controlling the frequency of the oscillation circuit.

15. The oscillator of claim 14, further comprising a second interface circuit that reads from or writes to a storage unit.

16. The oscillator of claim 14, wherein the first interface circuit is configured to receive the data signals from an external terminal.

17. The oscillator of claim 14, wherein the first interface circuit is a serial interface circuit and the data signals received by the first interface circuit are serial data signals configured to control the frequency of the oscillation circuit.

18. The oscillator of claim 17, wherein the first interface circuit is configured to convert each of the serial data signals into a data signal of N bits that is output to the D/A conversion circuit.

19. The oscillator of claim 1, wherein none of the output voltage of the D/A conversion circuit is used in the oscillation circuit to compensate for temperature changes.

20. An oscillator comprising:
a resonator;
an oscillation circuit which oscillates the resonator and includes a first variable capacitor element and a second variable capacitor element;
a reference voltage generation circuit that generates a reference voltage;
a D/A conversion circuit which receives digital data and the reference voltage for controlling a frequency of the oscillation circuit;
a serial interface circuit that receives serial data signals configured to control the frequency of the oscillation circuit and outputs the digital data to the D/A conversion circuit for controlling the frequency of the oscillation circuit;
a first temperature sensor; and
a temperature compensation circuit which is connected to the first temperature sensor;
wherein an output voltage of the D/A conversion circuit is applied to the first variable capacitor element, and
wherein an output voltage of the temperature compensation circuit is applied to the second variable capacitor element.

* * * * *